United States Patent
Harris et al.

(10) Patent No.: US 10,324,156 B2
(45) Date of Patent: Jun. 18, 2019

(54) SYSTEM AND METHOD TO CORRECT EDDY CURRENT ARTIFACTS IN MAGNETIC RESONANCE IMAGING

(71) Applicant: Synaptive Medical (Barbados) Inc., Bridgetown (BB)

(72) Inventors: Chad Tyler Harris, Toronto (CA); Andrew Thomas Curtis, Toronto (CA); Jeff Alan Stainsby, Toronto (CA); Geron André Bindseil, Toronto (CA)

(73) Assignee: Synaptive Medical (Barbados) Inc., Bridgetown (BB)

( * ) Notice: Subject to any disclaimer, the term of this patent is extended or adjusted under 35 U.S.C. 154(b) by 140 days.

(21) Appl. No.: 15/654,328

(22) Filed: Jul. 19, 2017

(65) Prior Publication Data

US 2019/0025397 A1     Jan. 24, 2019

(51) Int. Cl.
| | |
|---|---|
| *G01V 3/00* | (2006.01) |
| *G01R 33/565* | (2006.01) |
| *G01R 33/56* | (2006.01) |
| *G01R 33/48* | (2006.01) |

(52) U.S. Cl.
CPC ... *G01R 33/56518* (2013.01); *G01R 33/4824* (2013.01); *G01R 33/5608* (2013.01); *G01R 33/5659* (2013.01); *G01R 33/56563* (2013.01)

(58) Field of Classification Search
USPC .......................................................... 324/309
See application file for complete search history.

(56) References Cited

PUBLICATIONS

Robertson, S., et al., "Analysis of the temporal and spatial dependence of the eddy current fields in a 40-cm bore magnet," Magnetic Resonance in Medicine, 1992, 25(1):158-166.
Van Vaals, J.J., et al., "Optimization of eddy-current compensation," Journal of Magnetic Resonance, 1990, 90 (1):52-70.
Jehenson, P., et al., "Analytical method for the compensation of eddy-current effects induced by pulsed magnetic field gradients in NMR systems," Journal of Magnetic Resonance, 1990, 90(2):264-278.

(Continued)

*Primary Examiner* — Walter L Lindsay, Jr.
*Assistant Examiner* — Frederick Wenderoth
(74) *Attorney, Agent, or Firm* — Fish & Richardson P.C.

(57) ABSTRACT

Some implementations provide a MRI system configured to: access data encoding an input gradient waveform that would otherwise be used on a gradient sub-system of the MRI system to generate a gradient that corresponds to perturbations to the substantially uniform magnetic field; access data encoding a forward impulse response function and an inverse impulse response function, both characterizing a gradient generated from a target impulse input; pre-emphasizing the input gradient waveform by using both the forward impulse response function and the reverse impulse response function; and drive the gradient sub-system using the pre-emphasized gradient waveform such that distortions to the gradient caused by eddy currents within the gradient sub-system are substantially removed while radio-frequency (RF) samples for reconstructing an MRI image are being acquired from a grid that is substantially identical to when gradient sub-system is driven using the input gradient waveform.

20 Claims, 7 Drawing Sheets

(56) References Cited

PUBLICATIONS

Boesch, Ch., et al., "Temporal and spatial analysis of fields generated by eddy currents in superconducting magnets: optimization of corrections and quantitative characterization of magnet/gradient systems," Magnetic Resonance in Medicine, 1991, 20(2):268-284.

Addy, N.O., et al., "Simple Method for MR Gradient System Characterization and k-Space Trajectory Estimation," Magnetic Resonance in Medicine, 2012, 68(1):120-129.

Goora, F.G., et al., "Arbitrary magnetic field gradient waveform correction using an impulse response based pre-equalization technique," Journal of Magnetic Resonance, 2014, 238:70-76.

Vannesjo, S.J., et al., "Field Camera Measurements of Gradient and Shim Impulse Responses Using Frequency Sweeps," Magnetic Resonance in Medicine, 2014, 72:570-583.

Vannesjo, S.J., et al., "Gradient input optimization based on the measured system frequency response," Proc. Intl. Soc. Mag. Reson. Med. 24 (2016).

SYSTEM AND METHOD TO CORRECT EDDY CURRENT ARTIFACTS IN MAGNETIC RESONANCE IMAGING

BACKGROUND

The present disclosure relates to magnetic resonance imaging and thermal dissipation.

SUMMARY

In one aspect, some implementations provide a method for reducing eddy current artifacts of a magnetic resonance imaging (MRI) system having a main magnet that generates a substantially uniform magnetic field to image a subject placed therein. The method includes: driving the gradient sub-system of the MRI system using an input such that a gradient corresponding to perturbations to the substantially uniform magnetic field are generated; recording the perturbations to the substantially uniform magnetic field at one or more locations within the substantially uniform magnetic field; and calculating one or more impulse response functions each characterizing the perturbations to the substantially uniform magnetic field at a respective location therein when the gradient sub-system is driven by a target impulse input; and incorporating the respective impulse response functions into a pre-emphasized gradient waveform which, when used to drive the gradient sub-system for imaging the subject placed in the main magnet, generates a corrected gradient in which distortions caused by eddy currents are substantially removed while radio-frequency (RF) samples for reconstructing an MRI image are acquired from a grid that is substantially identical to when the gradient is corrected.

In some implementations, recording the perturbations to the main magnetic field includes: recording radio frequency (RF) signals from a field camera having more than one probes each placed at the respective location in the substantially uniform magnetic field; and measuring cumulative phases of the recorded RF signals that reflect the perturbations to the substantially uniform magnetic field at where the more than one probes were placed.

In some implementations, calculating the one or more impulse response functions includes determining a temporal strength of the gradient by taking a time derivative of the measured cumulative phase.

In some implementations, calculating the one or more impulse response functions includes spectrally processing the recorded perturbations to the substantially uniform magnetic field such that contributions to the recorded perturbations by the target impulse input are revealed.

In some implementations, spectrally processing the recorded perturbations includes: applying a first inverse filter to a spectrum component of the recorded perturbations to derive a forward impulse response from the target impulse input; and applying a second inverse filter to the spectrum component of the recorded perturbations to derive an inverse impulse response from the target impulse input, where the first and second inverse filters are regularized to substantially remove zeros at denominating positions.

In some implementations, the gradient runs along at least one spatial axes within the main magnetic field, where the at least one spatial axes are orthogonal to each other.

In some implementations, incorporating the respective impulse response functions into the pre-emphasized gradient waveform includes iteratively updating the input gradient waveform along each of the spatial axes by factoring in both the forward impulse response and the inverse impulse response.

In another aspect, some implementations provide a method for reducing eddy current artifacts of a magnetic resonance imaging (MRI) system having a main magnet that generates a substantially uniform magnetic field to image a subject therein. The method includes: accessing data encoding an input gradient waveform that would otherwise be used on a gradient sub-system of the MRI system to generate a gradient that corresponds to perturbations to the substantially uniform magnetic field; accessing data encoding a forward impulse response function and an inverse impulse response function, both characterizing a gradient generated from a target impulse input; pre-emphasizing the gradient waveform by using both the forward impulse response function and the reverse impulse response function; and driving the gradient sub-system using the pre-emphasized gradient waveform such that distortions to the gradient caused by eddy currents within the gradient sub-system are substantially removed while radio-frequency (RF) samples for reconstructing an MRI image are being acquired from a grid that is substantially identical to when the gradient sub-system is driven using the input gradient waveform.

In some implementations, the method further includes receiving and sampling radio-frequency (RF) signals from the subject placed in the main magnetic field when the gradient sub-system is being driven using the pre-emphasized gradient waveform as if the gradient sub-system is being driven using the input gradient waveform.

In some implementations, the method further includes reconstructing an MRI image from the sampled RF signals directly and without repositioning the sampled RF signals on a grid that differs from the grid substantially identical to when gradient sub-system is being driven using the input gradient waveform.

In some implementations, the gradient runs along more than one spatial axes within the main magnetic field, where the more than one spatial axes are orthogonal to each other.

In some implementations, pre-emphasizing the input gradient waveform includes iteratively updating the input gradient waveform along each of the spatial axes by factoring in both the forward impulse response and the inverse impulse response.

In some implementations, iteratively updating the gradient along each of the spatial axes includes: taking a time derivative of the input gradient waveform; and convolving the forward impulse response function with the time derivative of the input gradient waveform.

In some implementations, iteratively updating the gradient along each of the spatial axes includes: taking a time derivative of the input gradient waveform; and convolving the inverse impulse response function with the time derivative of the input gradient waveform; and subtracting, from the input gradient waveform, results of convolving the inverse impulse function with the time derivative of the input gradient waveform.

In some implementations, the input gradient waveform represents at least one of a gradient echo acquisition, a spin echo acquisition, an echo-planar imaging (EPI) acquisition, or a spiral acquisition.

In some implementations, the input gradient waveform leads to an accumulation of phase errors caused by eddy currents of the gradient sub-system, and where the accumulation of phase errors is substantially removed by the pre-emphasized gradient waveform.

In another aspect, some implementations provide a magnetic resonance imaging (MRI) system. The system includes a housing having a bore in which a subject to be imaged is placed; a main magnet accommodated by said housing and configured to generate a substantially uniform magnet field within the bore; a group of shimming coils placed around said housing and configured to increase a homogeneity of the magnetic field; pulse generating coils to generate and apply radio frequency (RF) pulses in sequence to scan the subject; a gradient sub-system including gradient coils to provide perturbations to the substantially uniform magnet field; and a control unit coupled to the main magnet and configured to perform a set of operations. The operations include: accessing data encoding an input gradient waveform that would otherwise be used on a gradient sub-system of the MRI system to generate a gradient that corresponds to perturbations to the substantially uniform magnetic field; accessing data encoding a forward impulse response function and an inverse impulse response function, both characterizing a gradient generated from a target impulse input; pre-emphasizing the input gradient waveform by using both the forward impulse response function and the reverse impulse response function; and driving the gradient sub-system using the pre-emphasized gradient waveform such that distortions to the gradient caused by eddy currents within the gradient sub-system are substantially removed while radio-frequency (RF) samples for reconstructing an MRI image are being acquired from a grid that is substantially identical to when gradient sub-system is driven using the input gradient waveform.

In some implementations, the control unit is configured to receive and sample radio-frequency (RF) signals from the subject placed in the main magnetic field when the gradient sub-system is being driven using the pre-emphasized gradient waveform as if the gradient sub-system is being driven using the input gradient waveform.

In some implementations, the control unit is configured to reconstruct an MRI image from the sampled RF signals directly and without repositioning the sampled RF signals on a grid that is different from the grid substantially identical to when gradient sub-system is driven using the input gradient waveform.

In some implementations, the gradient runs along more than one spatial axes within the main magnetic field, where the more than one spatial axes are orthogonal to each other.

In some implementations, pre-emphasizing the input gradient waveform includes iteratively updating the input gradient waveform along each of the spatial axes by factoring in both the forward impulse response and the inverse impulse response.

In some implementations, iteratively updating the gradient along each of the spatial axes includes taking a time derivative of the input gradient waveform; and convolving the forward impulse response function with the time derivative of the input gradient waveform.

In some implementations, iteratively updating the gradient along each of the spatial axes includes: taking a time derivative of the input gradient waveform; convolving the inverse impulse response function with the time derivative of the input gradient waveform; and subtracting, from the input gradient waveform, results of convolving the inverse impulse function with the time derivative of the input gradient waveform.

In some implementations, the input gradient waveform represents at least one of: a gradient echo acquisition, a spin echo acquisition, an echo-planar imaging (EPI) acquisition, or a spiral acquisition.

In some implementations, the input gradient waveform leads to an accumulation of phase errors caused by eddy currents of the gradient sub-system, and where the accumulation of phase errors are substantially removed by the pre-emphasized gradient waveform.

In another general aspect, some implementations a magnetic resonance imaging (MRI) system. The system includes: a housing having a bore in which a subject to be imaged is placed; a main magnet accommodated by said housing and configured to generate a substantially uniform magnet field within the bore; a group of shimming coils placed around said housing and configured to increase a homogeneity of the magnetic field; pulse generating coils to generate and apply radio frequency (RF) pulses in sequence to scan the subject; a gradient sub-system including gradient coils to provide perturbations to the substantially uniform magnet field; a control unit coupled to the main magnet and configured to perform a set of operations. The operations include: driving the gradient sub-system of the MRI system using an input such that a gradient corresponding to perturbations to the substantially uniform magnetic field are generated; recording the perturbations to the substantially uniform magnetic field at one or more locations within the substantially uniform magnetic field such that one or more impulse response functions are calculated, each characterizing the perturbations to the substantially uniform magnetic field at a respective location therein when the gradient sub-system is driven by a target impulse input, and the respective impulse response functions are incorporated into a pre-emphasized gradient waveform which, when used to drive the gradient sub-system for imaging the subject placed in the main magnet, generates a corrected gradient in which distortions caused by eddy currents are substantially removed while radio-frequency (RF) samples for reconstructing an MRI image are acquired from a grid that is substantially identical to when gradient is uncorrected.

In some implementations, the control unit is configured to record the perturbations to the main magnetic field by recording radio frequency (RF) signals from a field camera having more than one probes each placed at the respective location in the substantially uniform magnetic field such that cumulative phases of the recorded RF signals are measured to reflect the perturbations to the substantially uniform magnetic field at where the more than one probes were placed.

In some implementations, the one or more impulse response functions are calculated by taking a time derivative of the measured cumulative phase to determine a temporal strength of the gradient.

In some implementations, the one or more impulse response functions are calculated by spectrally processing the recorded perturbations to the substantially uniform magnetic field such that contributions to the recorded perturbations by the target impulse input are revealed.

In some implementations, spectrally processing the recorded perturbations includes: applying a first inverse filter to a spectrum component of the recorded perturbations to derive a forward impulse response from the target impulse input; and applying a second inverse filter to the spectrum component of the recorded perturbations to derive an inverse impulse response from the target impulse input, where the first and second inverse filters are regularized to substantially remove zeros at denominating positions.

In some implementations, the gradient runs along at least one spatial axes within the main magnetic field, where the at least one spatial axes are orthogonal to each other.

In some implementations, the respective impulse response functions are incorporated into the pre-emphasized gradient waveform by iteratively updating the gradient along each of the spatial axes by factoring in both the forward impulse response and the inverse impulse response such that the pre-emphasized gradient waveform is derived.

The details of one or more aspects of the subject matter described in this specification are set forth in the accompanying drawings and the description below. Other features, aspects, and advantages of the subject matter will become apparent from the description, the drawings, and the claims.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

In magnetic resonance imaging (MRI) systems, a main magnet generates a highly uniform static magnetic field over a certain volume for imaging purposes. The region of uniformity, also referred to as the uniform magnetic field or main field homogeneity, is typically characterized by the maximum static field deviation over a certain spherical volume. The main magnet is designed to achieve a specific homogeneity (e.g., an inhomogeneity below the threshold) in order to generate an MR image for the imaging volume. When a subject (e.g., a human head) is inserted into the MRI scanner, tissue and any implantable devices in the subject may also affect the homogeneity of the imaging. The homogeneity can typically be improved through fine adjustment of active shimming coils such that the specific homogeneity is met. Gradient coils generally provide field gradients that generate field fluctuations along certain directions for the uniform magnetic field. Such field fluctuations may cause magnetizations from various spatial locations to experience precessions at different frequencies, enabling encoding of spatial information of the magnetizations through RF excitation pulses.

Time-varying gradient fields generated by gradient coils during a MR imaging sequence can often result in the induction of undesirable time-varying eddy currents in nearby conductive materials. For instance, the induced eddy currents produce parasitic magnetic fields that often erode the quality of an image acquired during the MR image sequence.

The adverse impact of such eddy currents on image quality (e.g., image artifacts) can be reduced by the application of pre-emphasis pulse sequences when the conductive materials upon which such eddy currents have been induced are limited to components within the MRI system. For example, pre-emphasis sequences can be applied to initially measure amplitude, time-dependence, and spatial distribution of the parasitic magnetic fields. The magnetic fields can then be decomposed spatially into a linear basis set and temporally into a series of exponentials. The exponentials can then be used in pre-compensation network to adjust a gradient waveform generated and applied by a gradient coil to reduce the undesirable effects of the parasitic magnetic fields.

However, while conventional pre-emphasis techniques can be effective for medium to long time constant eddy currents (e.g., in the range of 1 ms to 500 ms), such techniques are often ineffective for eddy currents with short time constants in the same order as the rise time of the gradient waveforms (e.g., less than 1 ms). This is primarily due to problems associated with reliably and accurately measuring such short time constants. For example, conventional pre-emphasis techniques often involve measuring eddy currents after gradient waveforms have been generated and applied when most of the short time constant eddy current has already decayed away once the waveform has finished ramping. While not correcting for short-time constant eddy currents often does not significantly impact most Cartesian imaging sequences, this can be problematic for non-Cartesian acquisitions (e.g., spiral sequences).

Other techniques are often unable to correct for non-linear gradient amplifier responses. Certain loads, for example, have current amplitudes and ramp times that can appear correctly tuned (e.g., producing the desired share to a high degree of accuracy) for large amplitude pulses but can then oscillate when a low amplitude pulse is requested. When such loads are re-tuned for low amplitude pulses, this can often result in overshooting for large amplitude pulses. This can be problematic in many MRI imaging systems based on an assumption that the gradient field (e.g., coil and amplifier) can be a linear time invariant system. Often times, it can be more effective to tune the amplifier such that the current response is the same for both low and high amplitude pulses, which make the gradient field a linear time invariant system even if it does not produce the desired shape, which can be characterized and corrected as described herein.

According to selected embodiments, techniques can be used to calculate one or more impulse response functions that each characterize perturbations in a magnetic field produced by an MRI system. The perturbations can be measured at specified locations using a magnetic field camera with probes placed at each of the specified locations. The measured magnetic field can include parasitic fields produced by eddy currents, which are characterized in the measured perturbations. The calculated impulse response functions can be incorporated into a pre-emphasized gradient waveform that, when used to drive a gradient sub-system of the MRI system, generates a corrected gradient waveform that reduces the distortions caused by eddy currents. As described below, the corrected waveform can be generated such that the radio-frequency (RF) samples that are acquired for reconstructing an MRI image are substantially identical to the RF samples that are produced when the corrected gradient is applied.

For example, prior to conducting an imaging sequence, a magnetic field camera can be used to measure magnetic field perturbations produced after the application of a gradient waveform. The field measurements can be decomposed into a set of spatial profiles that represent a measured magnetic field along a particular axis. Impulse response functions are then computed for each spatial profile based on a deconvolution between a spatial profile with an ideal gradient waveform. The impulse response functions can then be used to predict the actual magnetic field with respect to time along a particular axis when a waveform is applied. The impulse response functions can be used to, for example, adjust acquired data during MRI image reconstruction, or correct the gradient waveform so that the acquisition trajectory is closer to a set of desired acquisition criteria as discussed below.

Figure 1A:
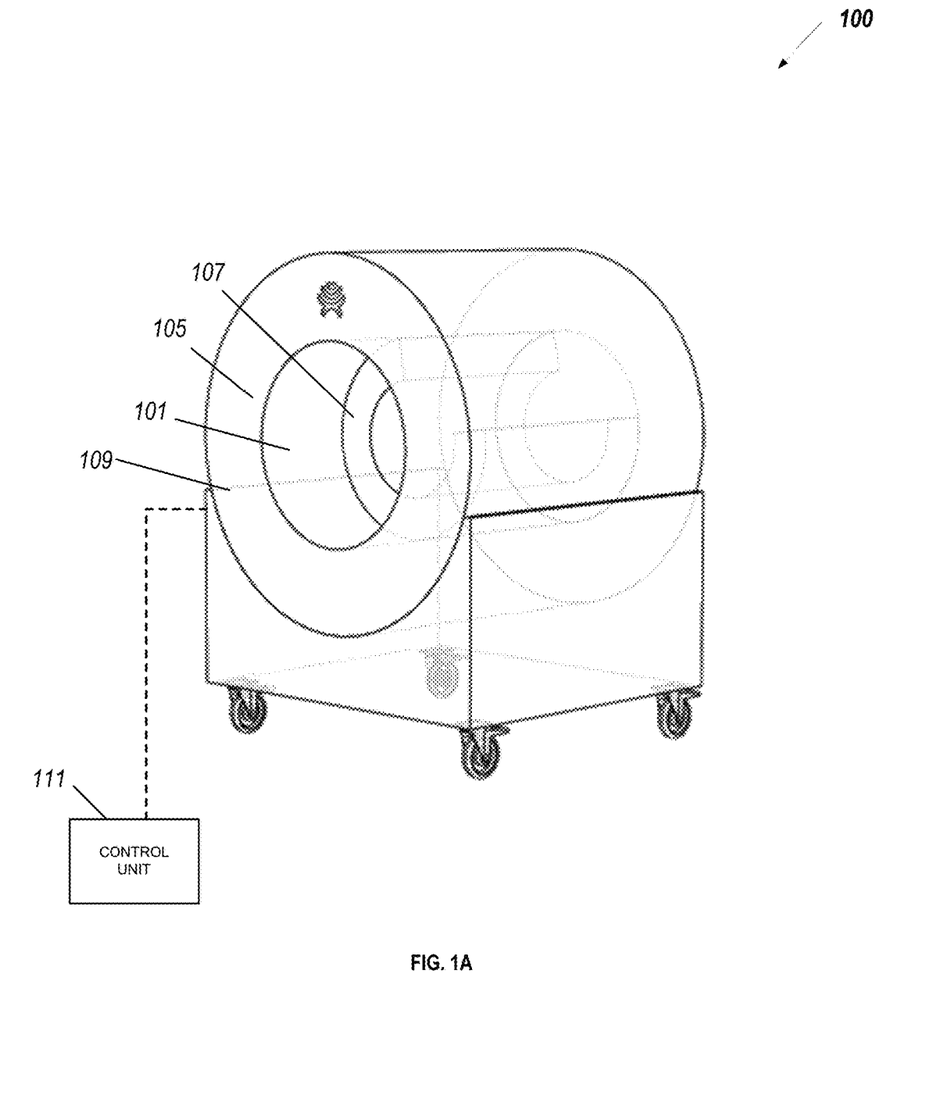
FIGS. 1A-1B show examples of a magnetic resonance imaging (MRI) system.
Figure 1B:
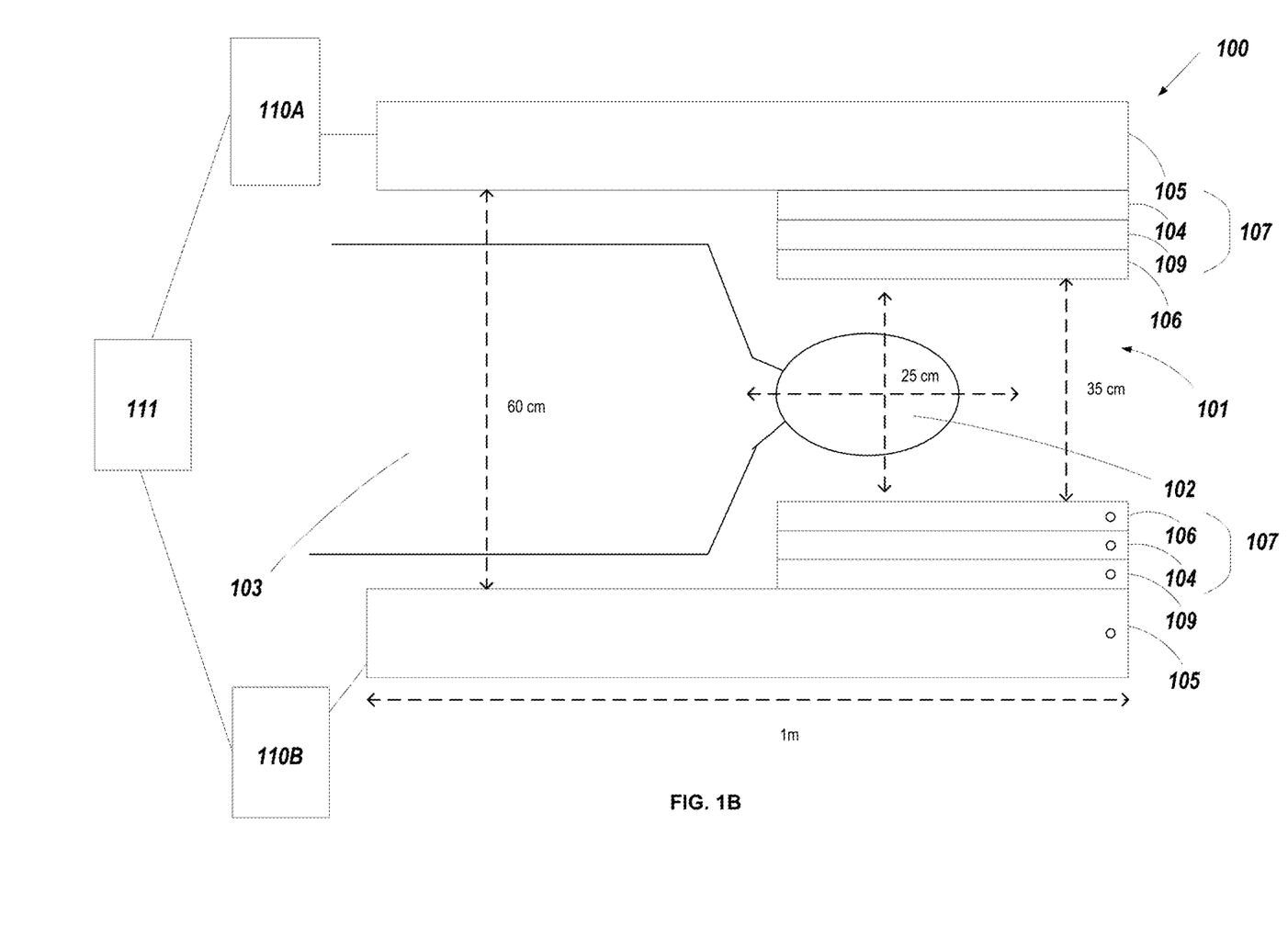

FIGS. 1A-1B show a perspective view and a cross-sectional view of an example of a magnetic resonance imaging (MRI) system 100 in which a solenoid magnet 105 is provided in a cylindrical shape housing with an inner bore 101. Coil assembly 107, including a pulse generating coil 106 and a gradient coil 104, is provided within solenoid magnet 105.

Coil assembly 107 may generally be shaped as an annular structure and housed within the inner bore of solenoid magnet 105. In some implementations, annular coil assembly 107 only includes one or more gradient coil 104. The Gradient coils 104 generally provide field gradients in more than one directions, such as, for example, all three orthogonal spatial directions. Thus, gradient coil 104 may refer to three sets of coils, each configured to generate field fluctuations in a respective direction for the main field in the inner bore of the solenoid magnet 105. Such field fluctuations may cause magnetizations from various spatial locations to experience precessions at different frequencies, enabling encoding of spatial information of the magnetizations through RF excitation pulses. The pulse generating coil 106 can be configured to generate and apply RF pulses to the volume of magnetic field in sequence to scan a portion of patient 103 (e.g., the head region 102).

For context, the main magnet of the MRI system 100 generates a highly-uniform static magnetic field over a certain volume for imaging purposes. Although small static field variations on the order of parts per million (ppm) can be tolerated, it is not possible to generate MR data in locations where the main field deviates too greatly (e.g., over hundreds of parts per million (ppm) over a 20-centimeter diameter spherical volume). For example, 40 ppm over a 25-cm diameter spherical volume (DSV) can represent a maximum $\Delta B0=B0max-B0min=20$ µT field deviation at a static field of $B0=0.5$ T.

The main magnet is designed to achieve a specific homogeneity (that is, the main magnet is designed to have an inhomogeneity below the threshold). However, the actual homogeneity at the installation site may be affected by material in or around the MRI scanner. At the time of installation, passive and/or active shim coils (e.g., shim coils 109) may be applied to improve the homogeneity so that it meets the specific homogeneity the main magnet is designed to achieve before subjects are placed in the inner bore 101.

When a subject (i.e. a human head) is inserted into the MRI scanner, the tissue and any implantable devices in the subject may also affect the homogeneity of the imaging volume and the homogeneity is again typically improved through fine adjustment of active shim coils, such as for example, through shim coils 109, so that the specific homogeneity is met.

Shim coils 109 are housed within the cylindrical walls of solenoid magnet 105. Shim coils 109 are powered by a group of power amplifiers 110A and 110B. In some cases, the power amplifiers 110A and 110B are housed in a control room and are connected to shim coils 109 to provide shimming of the magnetic field within inner bore 101. In driving shim coils 109, power amplifiers 110A and 110B are controlled by a control unit 111. The driving current for shim coils 109 may be in the range of hundreds of miliamperes and generally may not exceed 1 ampere. Further, shim coils 109 may not require active cooling using circulating coolant. In these implementations, an array of shimming coils can be used to provide adjustment to the field strength within the magnetic such that the magnet field within the inner bore 101 becomes more homogenous. The shimming coils 109 produce spatial magnetic field perturbations which are in well-defined polynomial spatial patterns (e.g. xy, $x^2$, $y^2$). In some implementations, the shimming coils 109 can by dynamically configured to produce arbitrary spatially varying patterns in the magnetic field.

The control unit 111 generally includes one or more processors as well as programming logic to configure the power amplifiers 110A and 110B to adjust the operation of the components of the system 100. As described more specifically below, the control unit 111 can be configured to perform various operations relating to gradient waveform adjustment and corrections as described below.

In some implementations, the control unit 111 can be used to drive the gradient coil 104 using an input such that a gradient corresponding to perturbations to the magnetic field are generated. The control unit 111 can record measured perturbations to the magnetic field at one or more locations, which are then used to calculate impulse response functions for the magnetic field in response to applying the gradient waveform. In such implementations, the control unit 111 is configured to record the perturbations by recording RF signals from a magnetic field camera that has probes placed at specified locations within the inner bore 101. For example, the control unit 111 can measure cumulative phases of the recorded RF signals to reflect the magnetic field perturbations at locations within the inner bore 101 where the probes are placed.

Additionally, or alternatively, the control unit 111 can be coupled to the main magnet 105 and coupled to perform various processing operations for data accessed and/or obtained from other system components. For example, the control unit 111 can access data encoding an input gradient waveform applied to the gradient coil 104, and data encoding a forward impulse response function and an inverse response function that both characterize a gradient generated from a target impulse input. The control unit 111 can then be used to pre-emphasize the input gradient waveform using the forward impulse response function and/or the reverse impulse response function, and drive the gradient coil 104 using the pre-emphasized gradient waveform. As described below, the application of the pre-emphasized gradient waveform can be used to reduce distortions to the gradient caused by, for example, eddy currents.

In some implementations, the control unit 111 can be configured to receive and sample RF signals from a subject placed in the main magnet 105 when the gradient coil 104 is being driven using the pre-emphasized gradient waveform. For example, once the pre-emphasized gradient waveform is applied, the control unit 111 can also receive and sample radio-frequency (RF) signals from a portion 102 of the subject 103 placed within the inner bore 101 when the gradient coils 104 are being driven using the pre-emphasized gradient waveform. For instance, the control unit 111 can automatically reconstruct an MRI image that is acquired based on sampling the RF signals directly without regridding the sampled RF signals, i.e., repositioning the sampled RF signals on a grid that is different from the grid intended for use with the input gradient waveform.

Figure 2:
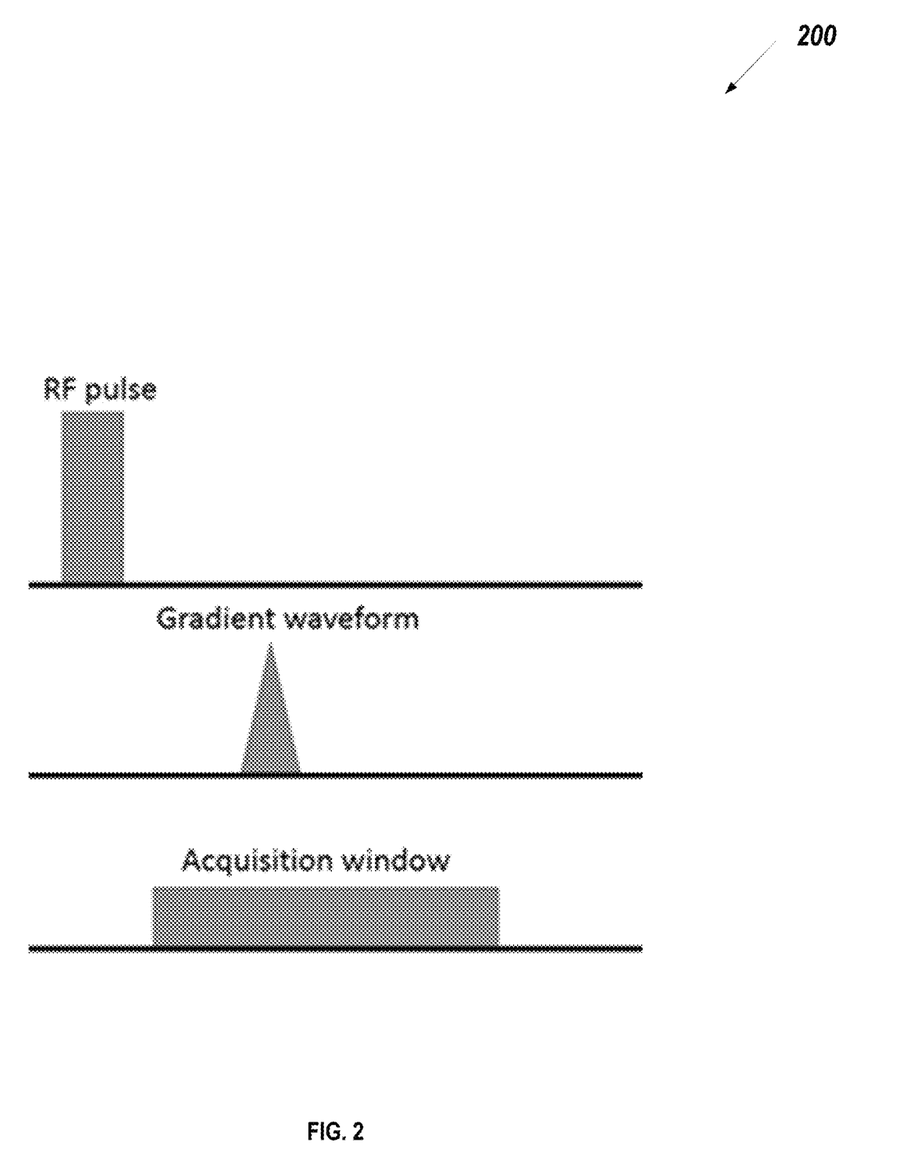
FIG. 2 shows an example of an impulse measurement sequence to measure the magnetic field produced during a gradient waveform.

FIG. 2 shows an example of an impulse measurement sequence 200 to measure the magnetic field produced during a gradient waveform. The impulse measurement sequence 200 is generally performed as a calibration scan prior to performing an imaging operation. The impulse measurement sequence 200 enables measurement of a magnetic field at different locations within an MRI system that are produced based on a gradient field of a gradient waveform depicted in the figure. The magnetic field can be measured using magnetic field camera that detects magnetic field after the gradient waveform is applied to the gradient coils 104. In the example, an excitation RF pulse is initially applied. An acquisition window is then placed to capture the applied gradient waveform. If a detected signal is known to only originate from a localized area, then the time derivative of the signal phase is proportional to the magnetic field measured at that location in space. The measured magnetic field includes parasitic fields as well as the magnetic fields produced by the gradient waveform and eddy currents. To compute the magnetic field produced by the gradient waveform and eddy currents only, the measured magnetic can be adjusted to remove the parasitic fields. This can be accomplished by subtracting the mean of the field during the initial portion of the acquisition window (e.g., during the time period prior the application of the gradient waveform).

Figure 3:
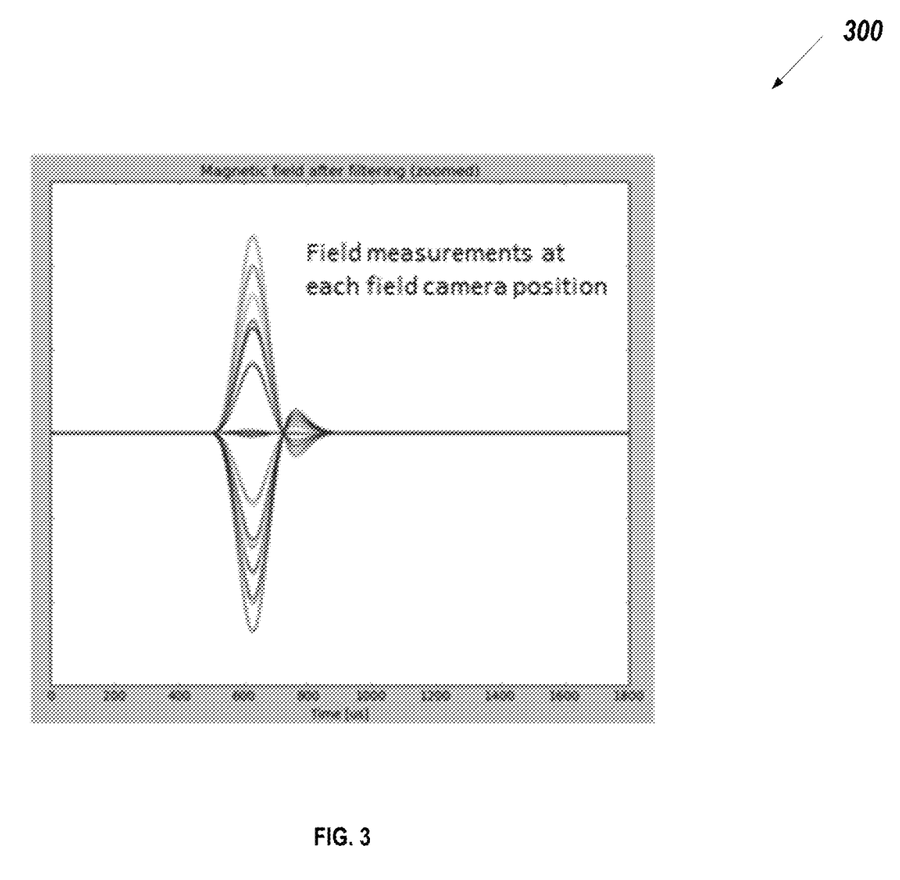
FIG. 3 shows an example of a chart that represents field measurements at multiple field camera positions.
Figure 4A:
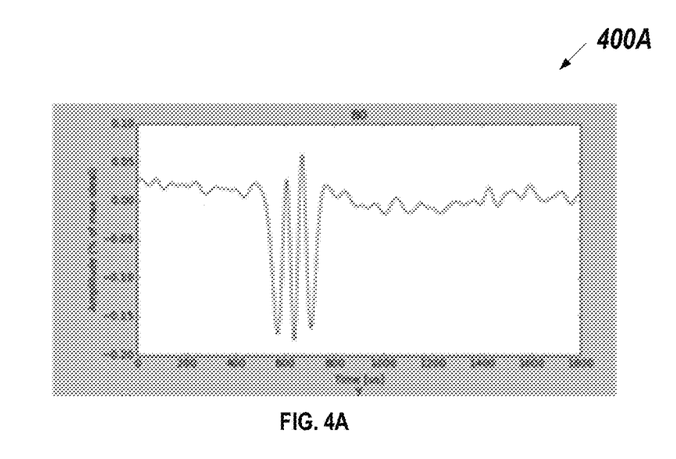
FIGS. 4A-4D show examples of charts that represent the field measurements of the chart in FIG. 3 decomposed into offset and gradient field profiles for a y-gradient triangular waveform as shown in FIG. 2.
Figure 4B:
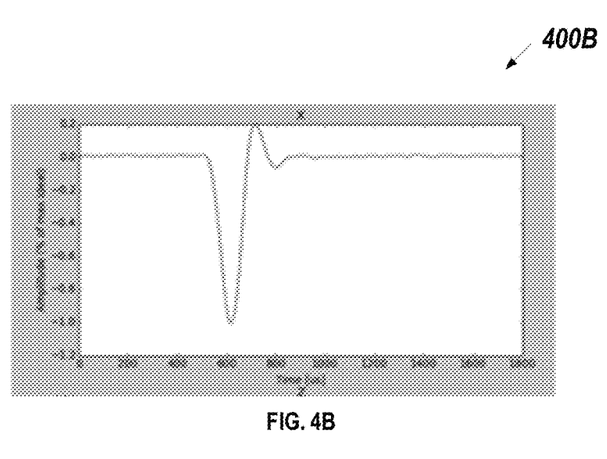
Figure 4C:
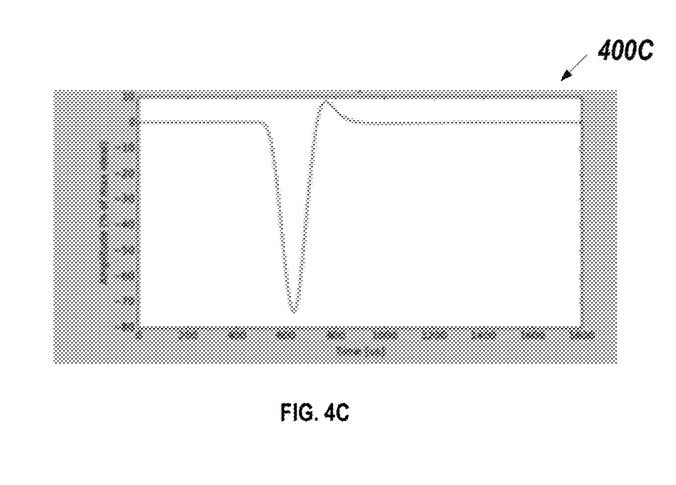
Figure 4D:
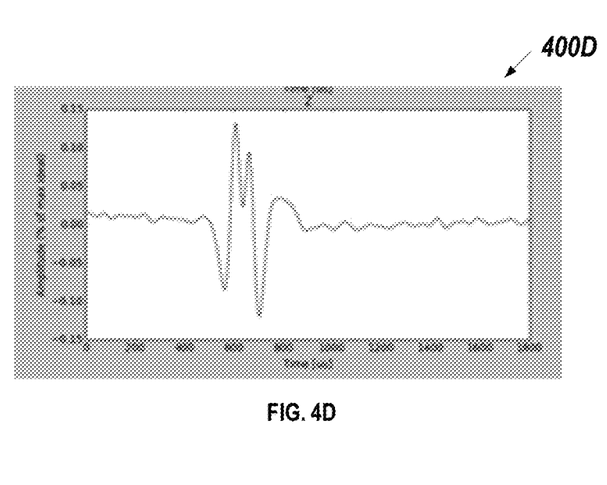
Figure 5A:
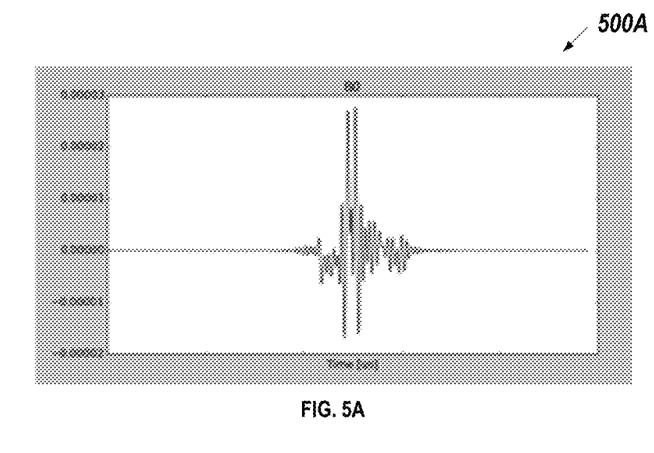
FIGS. 5A-5D show examples of charts that represent the forward impulse response functions for the y-gradient axis of the field measurements of the chart in FIG. 3.
Figure 5B:
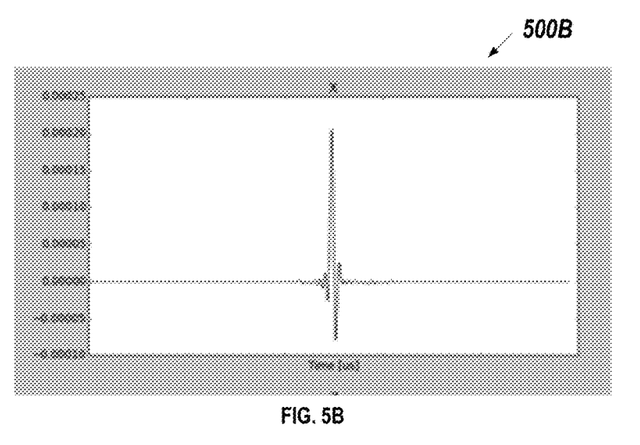
Figure 5C:
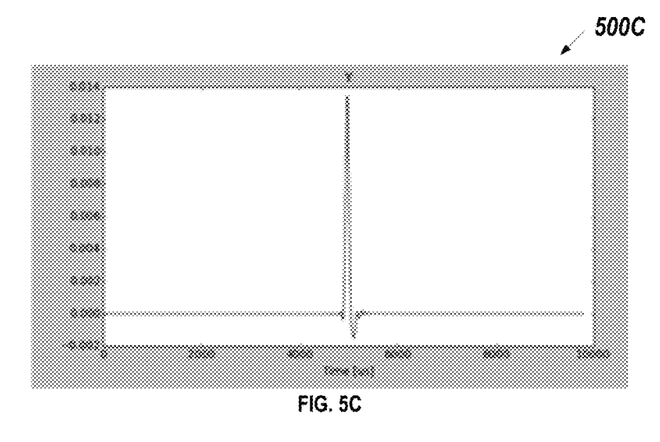
Figure 5D:
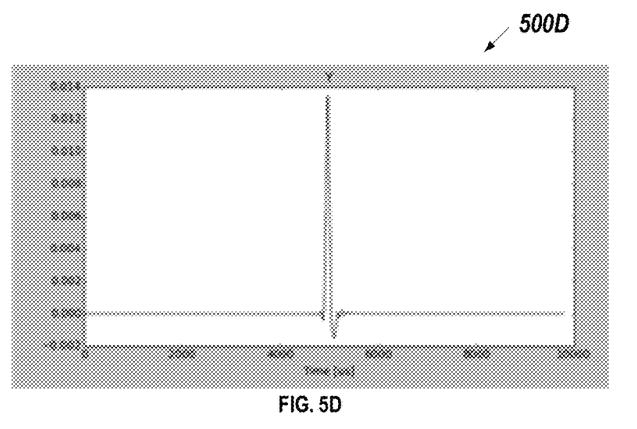

FIG. 3 shows an example of a chart 300 that represents magnetic field measurements at multiple field camera positions. The magnetic field measurements are performed at specific locations with the use of a magnetic field camera with probes that are placed at each of the specific locations. In the example depicted, magnetic field measurements are made using a 31-recevier channel field camera after the application of a y-gradient triangular waveform pulse as depicted in FIG. 2. In this example, 31 magnetic field measurements are collected at the locations of the 31 probes of the magnetic field camera.

FIGS. 4A-4D show examples of charts 400A-D that represent the field measurements of the chart in FIG. 3 decomposed into offset and gradient field profiles for a y-gradient triangular waveform as shown in FIG. 2. The magnetic field measurements illustrated in FIG. 3 are spatially decomposed to characterize the response of the MRI system to an input (e.g. the gradient waveform). For example, each of the charts 400A-D can represent gradient fields generated along spatial axis (e.g., x-axis, y-axis, z-axis) as a function of time, and deviations in the magnetic field as a function of time (e.g., B0). Each of the spatial profiles represented in the charts 400A-D can be used to represent, for example, qualities of the gradient amplifier, coils and/or presence of eddy current effects within the magnetic field produced after the application of the gradient waveform.

In the examples depicted, the magnetic field measurements in the chart 200 are decomposed into gradient field terms and a magnetic field deviation offset. For instance, the chart 400A represents the magnetic deviation offset as a function of time, chart 400B represents the time evolution of a linear gradient field measured along the x-axis, chart 400C represents a gradient field measured along the y-axis, and chart 400D represents a gradient field measured along the z-axis.

FIGS. 5A-5D show examples of charts 500A-D that represent the forward impulse response functions for field measurements of chart 400A-D, respectively. The impulse response functions can be calculated by a deconvolution of a particular field profile of each decomposed waveform (e.g., the field profiles that are each depicted in FIGS. 4A-4D) and an ideal gradient waveform. The ideal gradient waveform can be selected such that its frequency profile is non-zero over the available bandwidth of the gradient amplifier.

Various types of convolution techniques can be used to generate the impulse response functions. For example, in some implementations, a Wiener deconvolution can be used. Additionally, or alternatively, the deconvolution between a field profile of each decomposed waveform and the ideal gradient waveform is used to calculate the impulse response functions.

In the examples depicted, the charts 500A-D represent forward impulse response functions for the gradient waveform applied in the y-gradient axis. For instance, chart 500A illustrates a cross-term impulse response between the y-gradient waveform and the B0 cross-term. Charts 500B and 500C illustrate the cross-term impulse response functions for the y-x and y-z gradients, respectively, and the chart 500D illustrates the y-y impulse response function.

The computed impulse responses can be used to predict the actual field in time when an input gradient waveform is applied. This prediction accounts for gradient amplifier delay, gradient amplifier bandwidth, and eddy current effects. In this regard, impulse response information can be used to adjust acquired data during a MRI image reconstruction phase. For example, as described above in FIG. 1B, the control unit 110 can receive and sample RF signals from a subject placed in the magnet 105 when the gradient coil 104 is being driven using an input gradient waveform, and reconstruct an MRI image from the sampled RF signals directly and without regridding the sampled RF signals, i.e., realign the sampled RF signals to positions on a different grid than the one intended for signal reconstruction based on the input gradient waveform. In this example, the control unit 111 can apply a pre-emphasized gradient waveform as if the gradient coil 104 was driven using the input gradient waveform.

The impulse response functions illustrated in charts 500A-D can be calculated using the following techniques. In some implementations, cumulative phases of recorded RF signals that reflect the perturbations to the magnetic field produced by the magnet 105 at one or more specific locations corresponding to probes of the magnetic field camera are measured. Examples of measured perturbations are depicted in charts 400A-D. Time derivatives of the measured cumulative phases can be computed to determine a temporal strength of the gradient, which is represented in the impulse response function.

In some other implementations, the recorded perturbations to the magnetic field produced by the magnet 105 can be spectrally processed to identify contributions to the contributions. As described above, the identified contributions can include static inhomogeneities, perturbations attributable to the applied gradient waveform, and perturbations due to the presence of eddy currents. The identified contributions can be used to generate a pre-emphasized gradient waveform as discussed below. For example, a first inverse filter can be applied to a spectrum component of the recorded perturbations to derive a forward impulse response from the target impulse input. In this example, a second inverse filter can be applied to the spectrum component to derive an inverse impulse response from the target impulse input. The first and second inverse filters can be regularized to substantially remove zeros at denominating positions.

As described above, the impulse response information represented within the charts 500A-D can be used to adjust an input gradient waveform and generate a pre-emphasized gradient waveform that, when applied, adjusts the acquisition trajectory to produce a gradient field that is substantially similar to the gradient field produced by the input gradient waveform without field distortions due to the presence of eddy currents near an imaging region.

The pre-emphasized gradient waveform can be generated by iteratively updating the input gradient waveform along each spatial axes (e.g., the x, y, and z-axis of the gradient field) by factoring in both the forward and inverse impulse responses. For example, the forward impulse response for a particular spatial axis can be determined using equation (1):

$$IR = \text{real}\left(FT^{-1}\left\{\frac{H}{G}\left(\frac{GG^\dagger}{GG^\dagger + 1.0/(S+\epsilon)}\right)\right\}\right) \quad (1)$$

Where IR is the forward impulse response, H is the Fourier transform of the measured field profile, G is the Fourier transform of the ideal gradient waveform, † indicates complex conjugate, $\epsilon$ is a small number (e.g., 1 e$^{-9}$), and S is defined by equation (2):

$$S = W\sqrt{|HH^\dagger|} \quad (2)$$

where W is a window function for the frequency domain. The window function can be, for example, a Gaussian with mean zero and a standard deviation of 10 KHz. In some implementations, the width of the window function is selected based on the bandwidth response of the gradient amplifier.

An inverse impulse response for a particular spatial axis can be determined using equation (3):

$$IIR = \text{real}\left(FT^{-1}\left\{\frac{W_2 G}{H}\left(\frac{HH^\dagger}{HH^\dagger + 1.0/(S+\epsilon)}\right)\right\}\right) \quad (3)$$

where IIR is the inverse impulse response, H is the Fourier transform of the measured field profile, G is the Fourier transform of the ideal gradient waveform, † indicates complex conjugate, $\epsilon$ is a small number, and S is defined by the window function for the frequency domain as described above. In addition, $W_2$ is a second window function than the window function, W, applied in equation (2).

Figure 6:
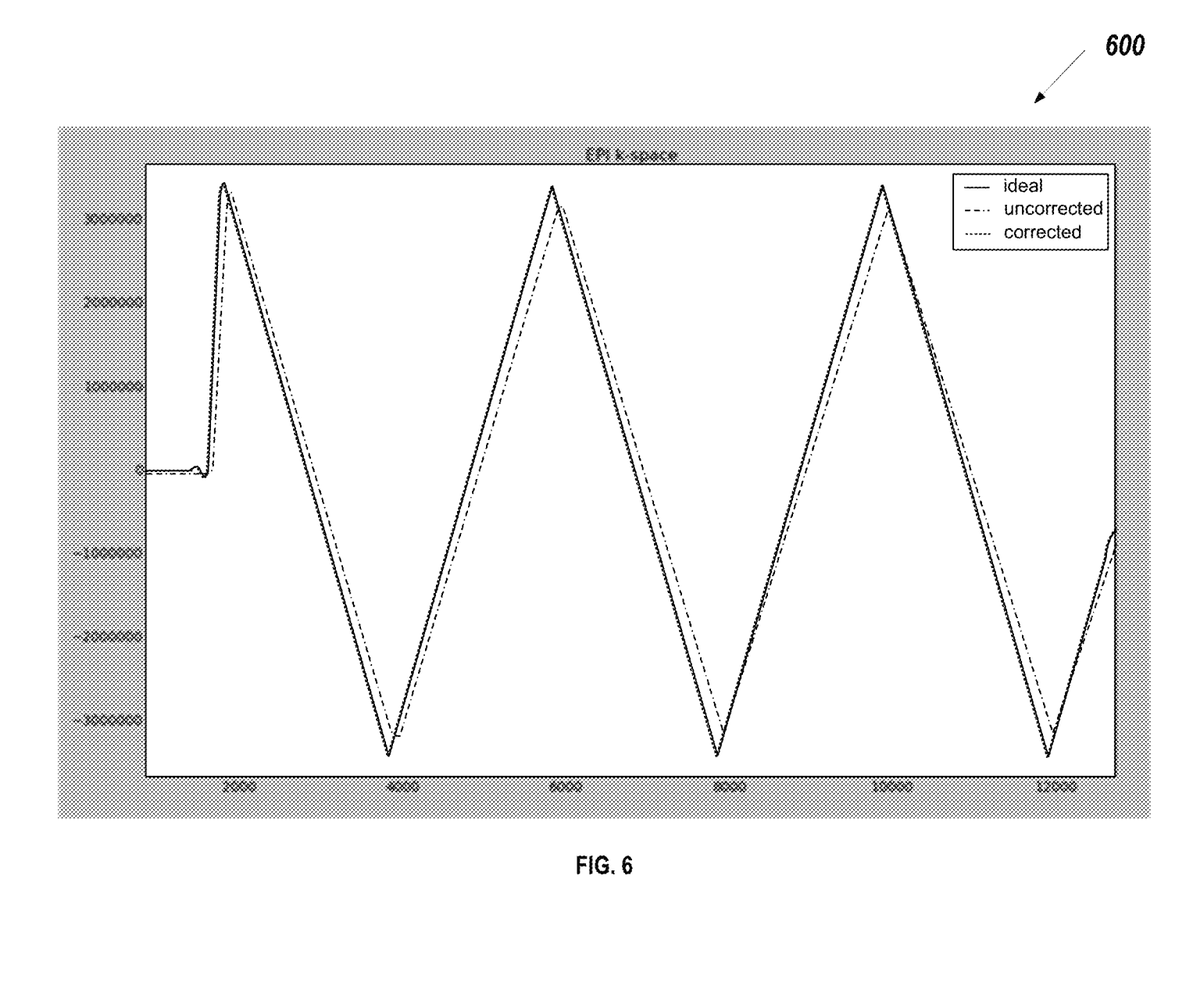
FIG. 6 shows an example of a chart that compares the k-space trajectories of a desired waveform, a simulated uncorrected waveform, and a simulated corrected waveform for a planar imaging (EPI) train.

Once the on-axis forward and inverse response functions are identified using equations (1) and (3), the input gradient waveform can be adjusted using the following exemplary convolution technique for a y-gradient pulse that is depicted in FIG. 2:
1. Convolve y-gradient waveform (y) with the y-y inverse impulse response function ($IIR_{yy}$) to generate a new y-gradient waveform, e.g., y'=y⊗$IIR_{yy}$
2. Convolve y' with the forward impulse response functions of the other cross-terms (e.g., y-B0, y-x, y-z, which are represented in FIGS. 500A-C respectively) ($IR_{yx}$, $IR_{yz}$) and subtract it from the current gradient waveform on the corresponding axis, e.g., x'=x−y'⊗$IR_{yx}$, z'=z−y'⊗$IR_{yz}$
3. Convolve the cross-term waveforms with their respective impulse response functions, x"=x'⊗$IIR_{xx}$
4. Repeat step 2 for other cross-terms, y'''=y"−x"⊗$IR_{xy}$, z'''=z"−x"⊗$IR_{xz}$
5. Repeat steps 1-4 until all waveforms converge FIG. 6 shows an example of a chart that compares the k-space trajectories of a desired waveform, a simulated uncorrected waveform, and a simulated corrected waveform for a planar imaging (EPI) train. In this example, the simulated corrected waveform is generated using the techniques described above. For example, the uncorrected waveform is initially applied as an input gradient waveform. Field measurements are then measured at specified locations using a magnetic field camera with multiple probes that are placed at the specified locations. The field measurements are then decomposed to identify gradient field terms and B0 offset. Forward and revere impulse responses are then identified using equations (1)-(3), which are then used to compute the corrected gradient waveform using the convolution technique described above. In this regard, the corrected waveform, in this example, represents a pre-emphasized input gradient waveform. As depicted in the figure, the corrected waveform more closely resembles the ideal waveform when compared to the uncorrected waveform, increasing the likelihood that the acquisition trajectory of the MRI system will be closer to what is desired when applying the input gradient waveform.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method for reducing eddy current artifacts of a magnetic resonance imaging (MRI) system having a main magnet that generates a substantially uniform magnetic field to image a subject placed therein, the method comprising:
   driving the gradient sub-system of the MRI system using an input such that a gradient corresponding to perturbations to the substantially uniform magnetic field are generated;
   recording the perturbations to the substantially uniform magnetic field at one or more locations within the substantially uniform magnetic field; and
   calculating one or more impulse response functions each characterizing the perturbations to the substantially uniform magnetic field at a respective location therein when the gradient sub-system is driven by a target impulse input; and
   incorporating the respective impulse response functions into a pre-emphasized gradient waveform which, when used to drive the gradient sub-system for imaging the subject placed in the main magnet, generates a corrected gradient in which distortions caused by eddy currents are substantially removed while radio-frequency (RF) samples for reconstructing an MRI image are acquired from a grid that is substantially identical to when the gradient is corrected.

2. The method of claim 1, wherein recording the perturbations to the main magnetic field comprises:

recording radio frequency (RF) signals from a field camera having more than one probes each placed at the respective location in the substantially uniform magnetic field; and measuring cumulative phases of the recorded RF signals that reflect the perturbations to the substantially uniform magnetic field at where the more than one probes were placed.

3. The method of claim 2, wherein calculating the one or more impulse response functions comprises:

determining a temporal strength of the gradient by taking a time derivative of the measured cumulative phase.

4. The method of claim 1, wherein calculating the one or more impulse response functions comprises:

spectrally processing the recorded perturbations to the substantially uniform magnetic field such that contributions to the recorded perturbations by the target impulse input are revealed.

5. The method of claim 4, wherein spectrally processing the recorded perturbations comprises:

applying a first inverse filter to a spectrum component of the recorded perturbations to derive a forward impulse response from the target impulse input; and applying a second inverse filter to the spectrum component of the recorded perturbations to derive an inverse impulse response from the target impulse input, wherein the first and second inverse filters are regularized to substantially remove zeros at denominating positions.

6. The method of claim 5, wherein the gradient runs along at least one spatial axes within the main magnetic field, wherein the at least one spatial axes are orthogonal to each other.

7. The method of claim 6, wherein incorporating the respective impulse response functions into the pre-emphasized gradient waveform comprises:

iteratively updating the input gradient waveform along each of the spatial axes by factoring in both the forward impulse response and the inverse impulse response.

8. A method for reducing eddy current artifacts of a magnetic resonance imaging (MRI) system having a main magnet that generates a substantially uniform magnetic field to image a subject therein, the method comprising:

accessing data encoding an input gradient waveform that would otherwise be used on a gradient sub-system of the MRI system to generate a gradient that corresponds to perturbations to the substantially uniform magnetic field;

accessing data encoding a forward impulse response function and an inverse impulse response function, both characterizing a gradient generated from a target impulse input;

pre-emphasizing the gradient waveform by using both the forward impulse response function and the reverse impulse response function; and driving the gradient sub-system using the pre-emphasized gradient waveform such that distortions to the gradient caused by eddy currents within the gradient sub-system are substantially removed while radio-frequency (RF) samples for reconstructing an MRI image are being acquired from a grid that is substantially identical to when the gradient sub-system is driven using the input gradient waveform.

9. The method of claim 8, comprising:

receiving and sampling radio-frequency (RF) signals from the subject placed in the main magnetic field when the gradient sub-system is being driven using the pre-emphasized gradient waveform as if the gradient sub-system is being driven using the input gradient waveform.

10. The method of claim 9, comprising:

reconstructing an MRI image from the sampled RF signals directly and without repositioning the sampled RF signals on a grid that differs from the grid substantially identical to when gradient sub-system is being driven using the input gradient waveform.

11. The method of claim 8, wherein the gradient runs along more than one spatial axes within the main magnetic field, wherein the more than one spatial axes are orthogonal to each other.

12. The method of claim 11, wherein pre-emphasizing the input gradient waveform comprises:

iteratively updating the input gradient waveform along each of the spatial axes by factoring in both the forward impulse response and the inverse impulse response.

13. The method of claim 12, wherein iteratively updating the gradient along each of the spatial axes comprises:

taking a time derivative of the input gradient waveform; and convolving the forward impulse response function with the time derivative of the input gradient waveform.

14. The method of claim 12, wherein iteratively updating the gradient along each of the spatial axes comprises:

taking a time derivative of the input gradient waveform; and convolving the inverse impulse response function with the time derivative of the input gradient waveform; and subtracting, from the input gradient waveform, results of convolving the inverse impulse function with the time derivative of the input gradient waveform.

15. The method of claim 8, wherein the input gradient waveform represents at least one of: a gradient echo acquisition, a spin echo acquisition, an echo-planar imaging (EPI) acquisition, or a spiral acquisition.

16. The method of claim 8, wherein the input gradient waveform leads to an accumulation of phase errors caused by eddy currents of the gradient sub-system, and wherein the accumulation of phase errors is substantially removed by the pre-emphasized gradient waveform.

17. A magnetic resonance imaging (MRI) system, comprising:

a housing having a bore in which a subject to be imaged is placed;

a main magnet accommodated by said housing and configured to generate a substantially uniform magnet field within the bore;

a group of shimming coils placed around said housing and configured to increase a homogeneity of the magnetic field;

pulse generating coils to generate and apply radio frequency (RF) pulses in sequence to scan the subject;

a gradient sub-system comprising gradient coils to provide perturbations to the substantially uniform magnet field;

a control unit coupled to the main magnet and configured to:

access data encoding an input gradient waveform that would otherwise be used on a gradient sub-system of the MRI system to generate a gradient that corresponds to perturbations to the substantially uniform magnetic field;

access data encoding a forward impulse response function and an inverse impulse response function, both characterizing a gradient generated from a target impulse input;

pre-emphasize the input gradient waveform by using both the forward impulse response function and the reverse impulse response function; and drive the gradient sub-system using the pre-emphasized gradient waveform such that distortions to the gradient caused by eddy currents within the gradient sub-system are substantially removed while radio-frequency (RF) samples for reconstructing an MRI image are being acquired from a grid that is substantially identical to when gradient sub-system is driven using the input gradient waveform.

18. The MRI system of claim 17, wherein the control unit is configured to:

receive and sample radio-frequency (RF) signals from the subject placed in the main magnetic field when the gradient sub-system is being driven using the pre-emphasized gradient waveform as if the gradient sub-system is being driven using the input gradient waveform.

19. The MRI system of claim 18, wherein the control unit is configured to:

reconstruct an MRI image from the sampled RF signals directly and without repositioning the sampled RF signals on a grid that is different from the grid substantially identical to when gradient sub-system is driven using the input gradient waveform.

20. The MRI system of claim 17, wherein the gradient runs along more than one spatial axes within the main magnetic field, wherein the more than one spatial axes are orthogonal to each other.

* * * * *